(12) United States Patent
Chen et al.

(10) Patent No.: US 7,410,889 B2
(45) Date of Patent: Aug. 12, 2008

(54) METHOD OF FABRICATING A POLY-SILICON THIN FILM

(75) Inventors: Yu-Cheng Chen, Hsinchu (TW); Jia-Xing Lin, Panchiao (TW); Hung-Tse Chen, Chupei (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 11/393,747

(22) Filed: Mar. 31, 2006

(65) Prior Publication Data

US 2007/0134892 A1 Jun. 14, 2007

(30) Foreign Application Priority Data

Dec. 12, 2005 (TW) .............................. 94143926 A

(51) Int. Cl.
*H01L 21/20* (2006.01)
(52) U.S. Cl. .................. 438/487; 438/166; 438/486
(58) Field of Classification Search ................ 438/487, 438/150, 166, 486, 799
See application file for complete search history.

(56) References Cited

U.S. PATENT DOCUMENTS

| 5,705,413 | A  | * | 1/1998  | Harkin et al. ............... 438/155 |
| 5,851,862 | A  | * | 12/1998 | Ohtani et al. ............... 438/166 |
| 6,372,039 | B1 | * | 4/2002  | Okumura et al. ............. 117/8 |
| 2002/0009818 | A1 | * | 1/2002 | Yoshimoto .................. 438/30 |
| 2002/0052069 | A1 | * | 5/2002 | Jiroku et al. ............... 438/166 |
| 2002/0102821 | A1 | * | 8/2002 | Voutsas ...................... 438/487 |
| 2004/0235276 | A1 | * | 11/2004 | Lin ............................ 438/487 |

FOREIGN PATENT DOCUMENTS

CN 1304548 A 7/2001

* cited by examiner

*Primary Examiner*—Kevin M Picardat
(74) *Attorney, Agent, or Firm*—Rabin & Berdo, PC

(57) ABSTRACT

A silicon layer and a heat-retaining layer are formed on a substrate in turn, and a laser beam with a sharp energy density gradient is next utilized to perform a laser heating process for inducing super lateral growth crystallization occurred in part of the Si layer. The heat-retaining layer provides additional heating-enhancement function for the Si layer in crystallization so as to increase the super lateral growth length. Then, the laser beam is repeatedly moved to irradiate the substrate to finish the crystallization process for the full substrate.

10 Claims, 13 Drawing Sheets

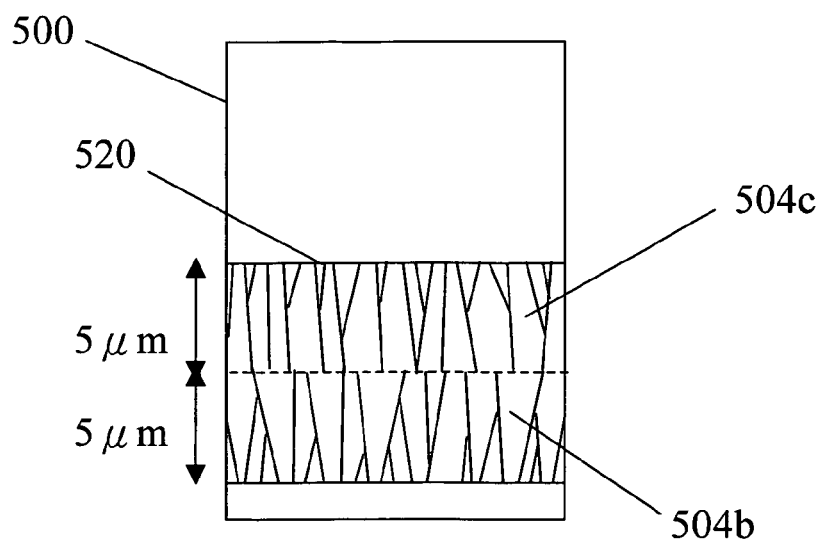
Fig. 5A
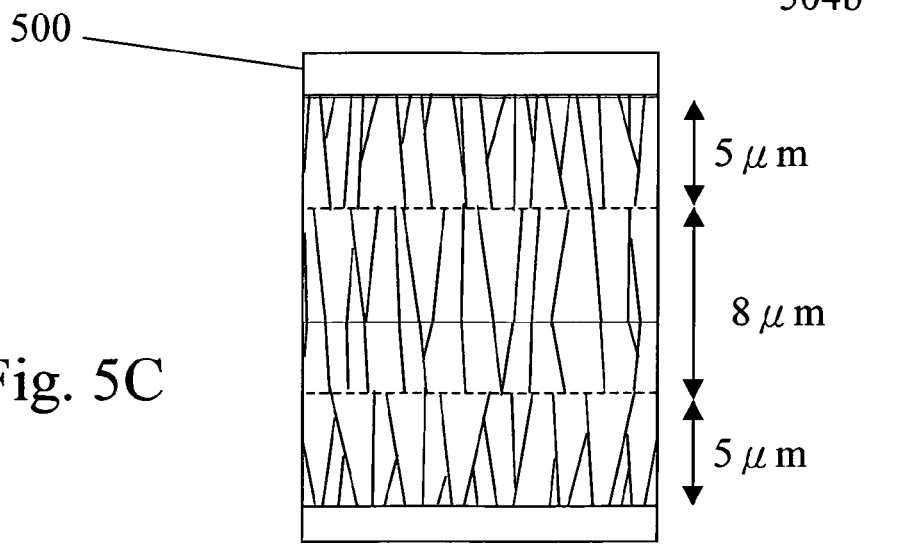
Fig. 5B
Fig. 5C

METHOD OF FABRICATING A POLY-SILICON THIN FILM

RELATED APPLICATIONS

The present application is based on, and claims priority from, Taiwan Application Serial Number 94143926, filed Dec. 12, 2005, the disclosure of which is hereby incorporated by reference herein in its entirety.

BACKGROUND OF THE INVENTION

1. Field of Invention

The invention relates to a method of fabricating a poly-silicon (poly-Si) thin film and, in particular, to a method of fabricating a poly-Si thin film with super lateral growth crystals with applications in poly-Si thin film transistors (TFT) or devices with poly-Si thin films.

2. Related Art

The poly-Si has superior electrical properties than the amorphous silicon (a-Si) and the advantage of lower cost than the single silicon crystal. Therefore, it has received a lot of attention in the field of TFT productions recently. It is particularly important in the application of TFT liquid crystal displays (LCD).

However, the grain size of the poly-Si has a great influence on the electron mobility and device properties. The grain boundaries existing in the poly-Si, in particular, are the obstacles when carriers in the device pass through the gate channel. Therefore, how to enlarge the grain size of the poly-Si and thus reduce the number of grain boundaries for enhancing the TFT device properties is an important trend in the poly-Si thin film fabrication technology nowadays. Take the display technology as an example. It is imperative to produce highly-efficient TFF's in order to develop better flat-panel displays.

The conventional method of fabricating the poly-Si thin film is called the solid phase crystallization. However, since the highest temperature that a glass substrate can tolerate is only 650° C. This method is not suitable for making flat-panel displays. Another method is to vapor-deposit the poly-Si thin film directly. Nevertheless, the grain size of the poly-Si formed using either method is very small, at about the order of 100 nm. Consequently, the properties of the poly-Si thin films formed in these ways are not perfect.

Currently, the most commonly used method in fabricating the poly-Si thin film is the excimer laser annealing technology. Although a grain size of about 600 nm can be achieved in this case, it is still insufficient for making high-performance flat-panel displays. Therefore, in recent years, the sequential lateral solidification (SLS) technology has been proposed. Photo masks are utilized to define the pattern of the laser beam, so that the laser irradiates specific parts of the silicon layer, thereby inducing super lateral growth crystallization. By moving the substrate, the laser beam can repeatedly fall on the lateral crystallization region of the poly-Si layer for the crystal grains to grow continuously.

According to the SLS technology, the moving distance of the laser beam has to be smaller than the lateral growth distance of the crystals in the silicon layer, so that the laser irradiated positions fall right on the poly-Si grains of the previous lateral growth crystallization for the grains to continuously grow. However, using the normal laser crystallization techniques that are currently available, the precision of the laser irradiated positions has to relatively high, usually at the order of sub-microns.

Take the dot-SLS technology as another example, shown in FIG. 1B and FIGS. 2A to 2H. FIG. 1 shows the photo mask pattern for the laser beam in the conventional dot-SLS technology. FIGS. 2A to 2H are schematic top views of the crystallization steps in the conventional dot-SLS technology.

In FIG. 1, the dot photo mask 111 is used to block the passage of the laser beam. The region 122 that is not blocked by the dot photo mask 111 is where the laser beam can pass through during the laser crystallization process. Please refer to FIGS. 2A to 2H for an explanation of crystallization process using the current dot-SLS technology. In FIG. 2A, the region 220 represents the position where the silicon layer is actually irradiated by the laser beam. The dot region 210 represents the position where the silicon layer is not irradiated by the laser beam due to the dot photo mask. As the initial dot photo mask covers the central position of the region irradiated by the laser beam, the crystallization in the silicon layer starts from the border of the dot region 210 at the center of the laser beam irradiated region blocked initially by the dot photo mask. The crystallization continues in the radial direction, with a lateral growth crystallization length of about 2 µm. The pattern of the grain boundaries 205 shows the crystallization direction and structure of the poly-Si.

Afterwards, the irradiation position of the laser beam is first moved, as shown in FIG. 2B. The dot region 210 is moved to the position 212 (dashed line), so that the dot region 210 is moved within the range of any lateral crystallization for second laser irradiation. Therefore, outward sequential lateral crystallization of the Si crystal layer starts from the outer border of the position 212. The grain grows in such a way to eliminate some of the grain boundaries 205, forming the crystal state illustrated in FIG. 2C.

Afterwards, the irradiation position of the laser beam is moved for the second time, so that dot region 210 is moved from the position 212 to the position 214, falling within the range of another lateral crystallization, as shown in FIG. 2D. A third laser irradiation is performed to further remove some grain boundary 205, forming the crystal state shown in FIG. 2E.

If the irradiation position of the third laser beam is further moved so that the dot region 210 moves from the position 214 to the position 216, there is a very large probability for the dot region 210 to fall right on the position without any grain boundary in addition to any poly-Si lateral crystallization, as shown in FIG. 2F.

Finally, a fourth laser irradiation is performed to further remove the grain boundary 205. Therefore, one obtains a crystal state with no grain boundary as shown in FIG. 2G. Using this dot-SLS technique can possibly reach a crystal grain close to a single crystal structure as shown in FIG. 2H.

However, since the size of the dot region is usually about 1.5 µm in diameter but each moving of the dot region has to fall within the range of poly-Si lateral crystallization, i.e., 2 µm, the precision in moving the laser beam has to achieve the sub-µm level. Only with such a precision can one obtain a poly-Si grain with a size close to 5 µm after four times of laser irradiation (FIG. 2H).

Therefore, using the SLS technique or the dot-SLS technique, the production will be limited by the strict requirement in the moving precision of the substrate or the laser beam. This will greatly increase the machine cost and lower the yield. It is particularly difficult for large-area panel production. Therefore, even though the SLS technique can improve the current laser crystallization technique, it is still not suitable for the mass production of poly-Si devices.

SUMMARY OF THE INVENTION

An objective of the invention is to provide a method of fabricating poly-Si thin film used in fabricating poly-Si TFT's or devices containing poly-Si thin films. This method utilizes a laser beam with a sharp energy density gradient to irradiate the Si film, so that a solid-liquid interface is generated on the Si film, inducing super lateral crystallization in part of the Si film. At the same time, the heat-retaining layer covers on the Si layer to elongate the heating time thereof, promoting the lateral growth crystallization. Afterwards, the laser beam is repeatedly moved to different positions on the substrate for irradiation. This completes the crystallization process of the entire substrate.

In accord with the above objective, the invention provides a method of fabricating a poly-Si thin film. A buffer layer is first formed on a substrate, followed by the deposition of an a-Si layer. Afterwards, a heat-retaining layer is formed on the a-Si layer. The material of the heat-retaining layer is selected to have partial absorption for the laser beam energy. For example, it is preferably to be a $SiO_xN_y$ layer. The heat-retaining layer provides a continuous heating effect for the a-Si layer in the subsequent laser heating process. This can effectively elongate the crystallization time of the a-Si layer, increasing the grain size in the lateral growth.

After the heat-retaining layer is formed, a laser beam with a sharp energy density gradient is used to perform the laser heating process, melting part of the Si layer and thus inducing super lateral growth crystallization.

The laser beam with a sharp energy density gradient is formed using a pattern photo mask to cover part of the laser source. Alternatively, one may pass the laser beam through an optical system, adjusting it into a linear beam with a narrow width of 3~20 μm. The pattern photo mask can be a pattern with a long stripe slit or square opening. The sharp energy density gradient fall in the range of 400 $J/cm^3$~3000 $J/cm^3$.

In accord with the above-mentioned fabrication method of a poly-Si thin film, the laser beam with a sharp energy density gradient falls in sequence on the grains of the poly-SI layer by moving the substrate or the laser beam, in addition to using the heat retaining layer to delay the cooling time of the poly-Si and using the laser beam with a sharp energy density gradient to induce super lateral growth crystallization. This can produce sequential lateral crystallization, continuously enlarging the crystal grain size.

The invention utilizes the design of covering a heat-retaining layer on the Si layer to effectively elongate the crystal growth time of the Si film after being irradiated by a laser beam. Therefore, the crystal grain size is enlarged. The control range of the displacement distance of the substrate or the laser beam can be greatly increased in the subsequent steps. The production window is augmented, thereby reducing the precision requirement of moving the substrate or the laser beam.

Using the disclosed method, not only can one use a single laser beam to irradiate and make lateral growth crystallization up to the micron level or even above 5 μm. Moreover, the invention can increase the production yield while improving the quality of the fabricated poly-SI thin film. In particular, the disclosed method is suitable for the development and mass production of large-area displays when making TFT's driven by the display.

Another effect of the disclosed method is to reduce the surface roughness of the poly-Si. Using the structure of covering a heat-retaining layer on the Si layer, bumps of the poly-Si at the grain boundaries can be suppressed during the crystallization of the Si film. Therefore, the invention renders a flatter poly-Si surface.

BRIEF DESCRIPTION OF THE DRAWINGS

These and other features, aspects and advantages of the invention will become apparent by reference to the following description and accompanying drawings which are given by way of illustration only, and thus are not limitative of the invention, and wherein:

FIGS. 5A~5C are schematic top views of part of the procedure in a method of fabricating poly-Si thin films according to the first embodiment of the invention;

DETAILED DESCRIPTION OF THE INVENTION

The present invention will be apparent from the following detailed description, which proceeds with reference to the accompanying drawings, wherein the same references relate to the same elements. The invention provides a method that can enlarge lateral crystallization of poly-Si. The combination of a heat-retaining layer and the lateral crystallization technique induced by a laser beam with a sharp energy density gradient increases the lateral growth distance of the poly-Si grains. This can greatly reduce the precision requirement in moving the substrate of the laser beam during the sequential lateral crystallization process. The production window is augmented, thereby reducing the precision requirement of moving the substrate or the laser beam. Besides, with only a single laser beam, one can obtain a poly-Si thin film with a grain lateral crystallization length as much as 5 μm or above. The quality and yield of the fabricated poly-Si thin film are simultaneously improved. In the following, embodiments are used to explain the disclosed method.

Embodiment 1

Please refer to FIGS. 3A~3C, 4A, 4B, and 5A~5C for the explanation of the embodiment.

Figure 1:
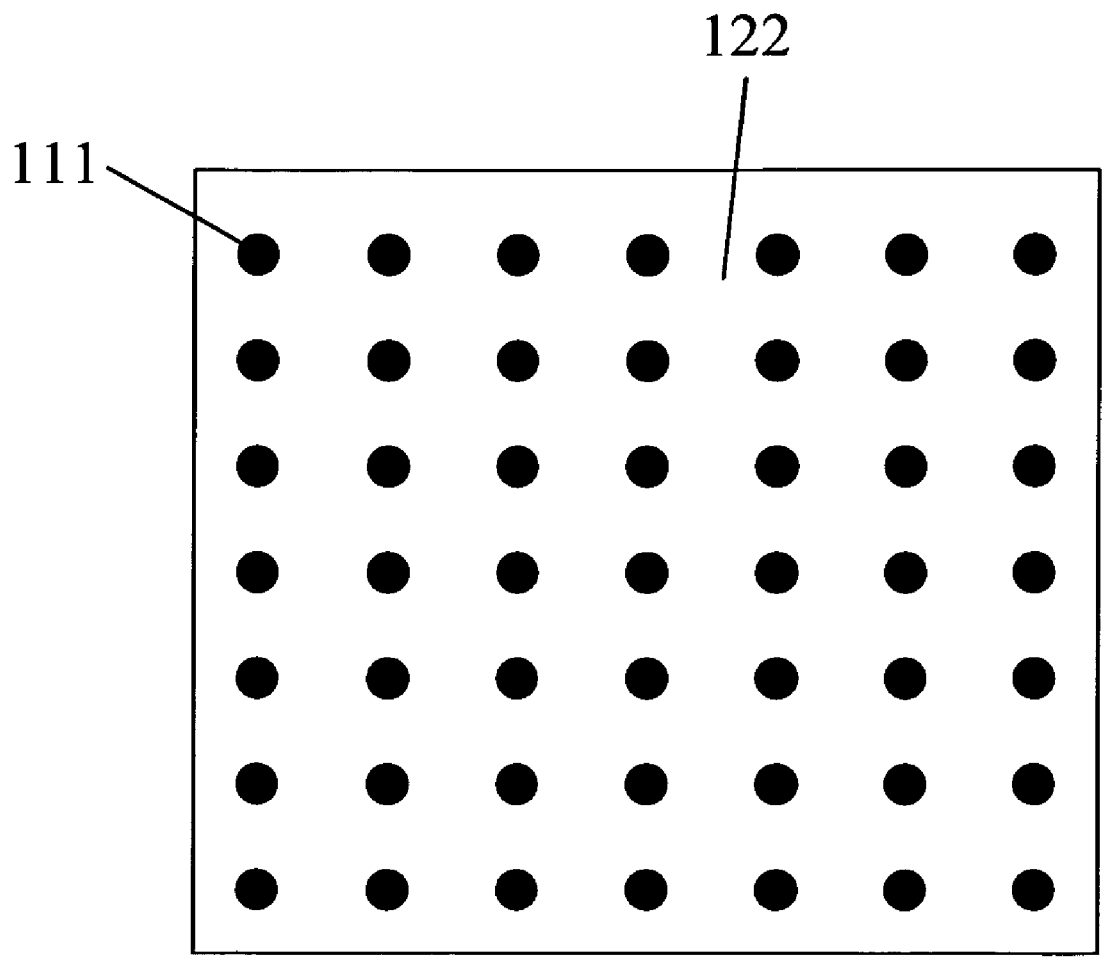
FIG. 1 is a photo mask pattern for the laser beam used in the conventional dot-SLS technique.
Figure 2A:
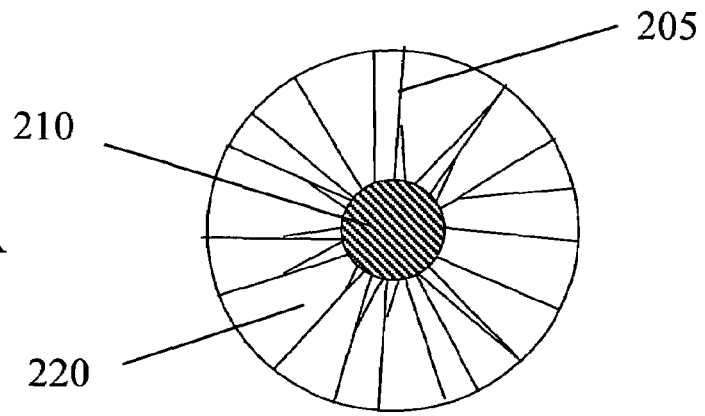
FIGS. 2A~2H top schematic top views of the crystallization process using the conventional dot-SLS technique.
Figure 2B:
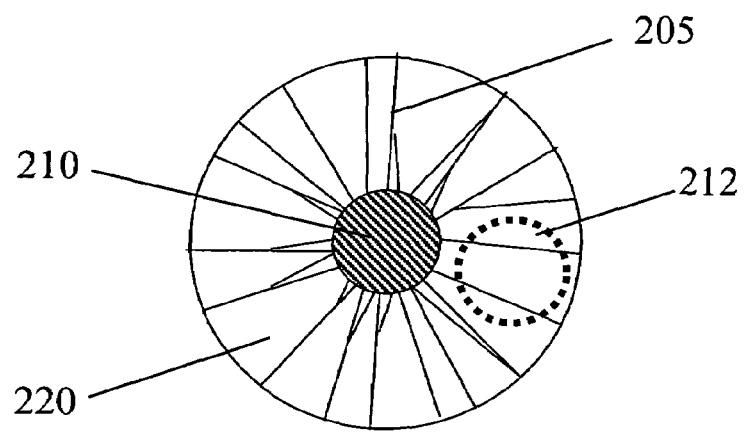
Figure 2C:
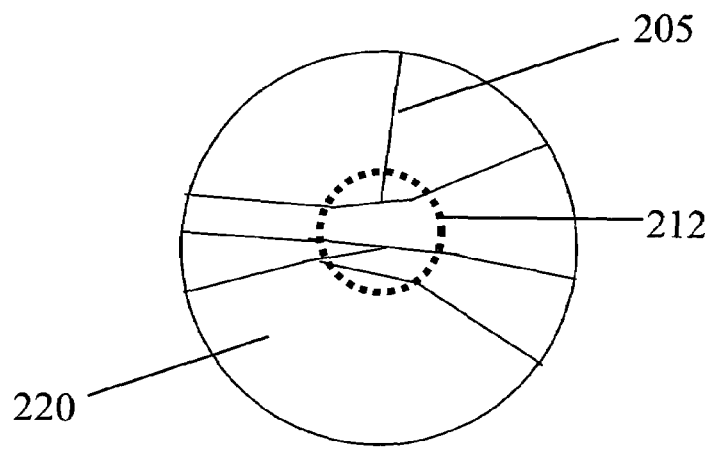
Figure 2D:
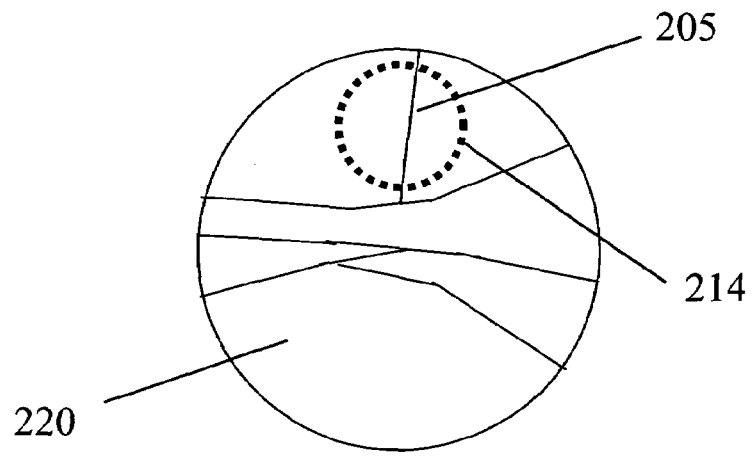
Figure 2E:
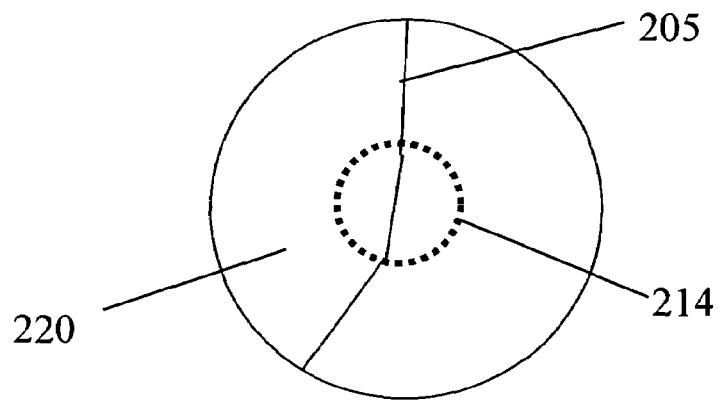
Figure 2F:
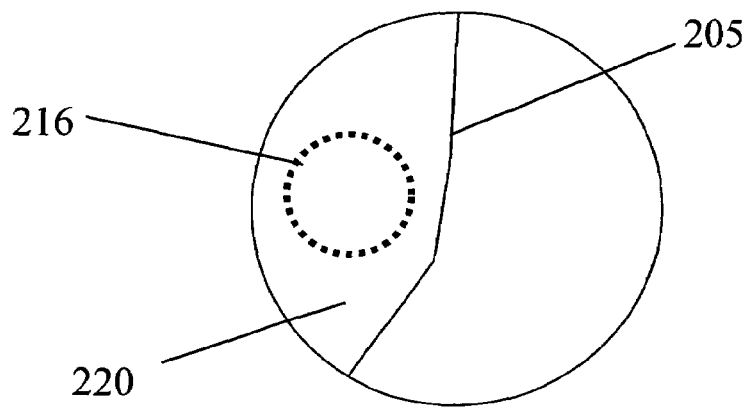
Figure 2G:
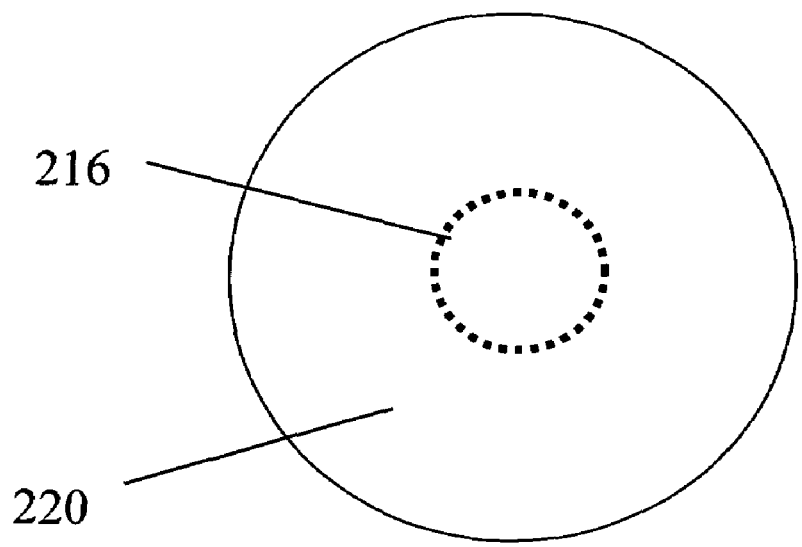
Figure 2H:
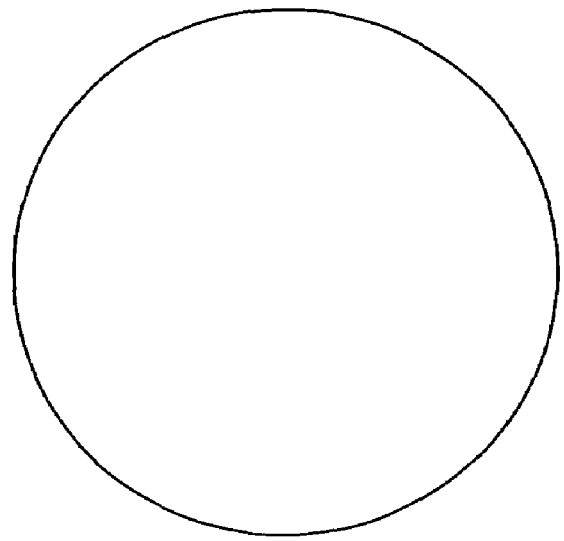
Figure 3A:
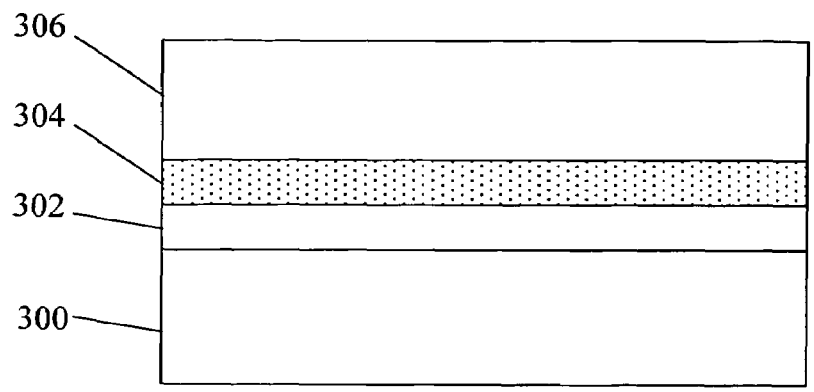
FIGS. 3A~3C are schematic cross-sectional views of a method of fabricating poly-Si thin films according to a first embodiment of the invention.

As shown in FIG. 3A, a buffer layer 302 and an a-Si layer 304 are formed in sequence on a substrate 300. The substrate 300 may be made of glass. The buffer layer 302 is preferably silicon oxide in order to separate the substrate 300 from the a-Si layer 304. The impurities in the substrate 300 are thus prevented from polluting the a-Si layer 304. The formation of the a-Si layer 304 may use the plasma enhanced chemical vapor phase deposition (PECVD) technique or the physical vapor deposition (PVD) technique. Also, a de-hydrogenation process can be performed for the a-Si layer 304 to prevent hydrogen explosion in the subsequent laser processing.

Afterwards, a heat-retaining layer 306 is formed to cover the a-Si layer 304. The material of the heat-retaining layer 306 is selected to be a thin film that can partially absorb the laser beam energy, such as a $SiO_xN_y$ film. The $SiO_xN_y$ film can be fabricated using the PECVD technique. A preferred thickness of the heat-retaining layer 306 is in the range of 450 nm to 600 nm.

Figure 3B:
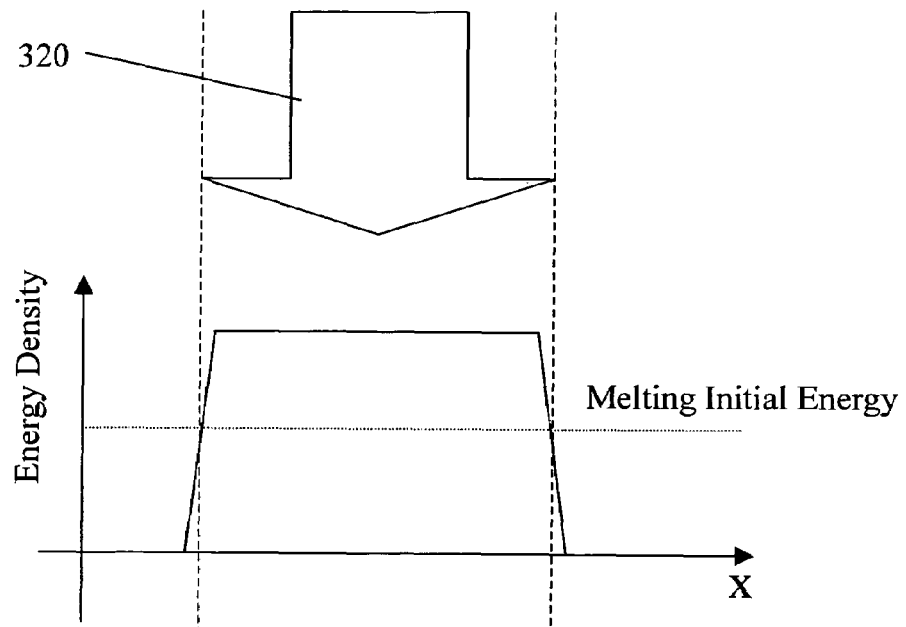
Figure 3B:
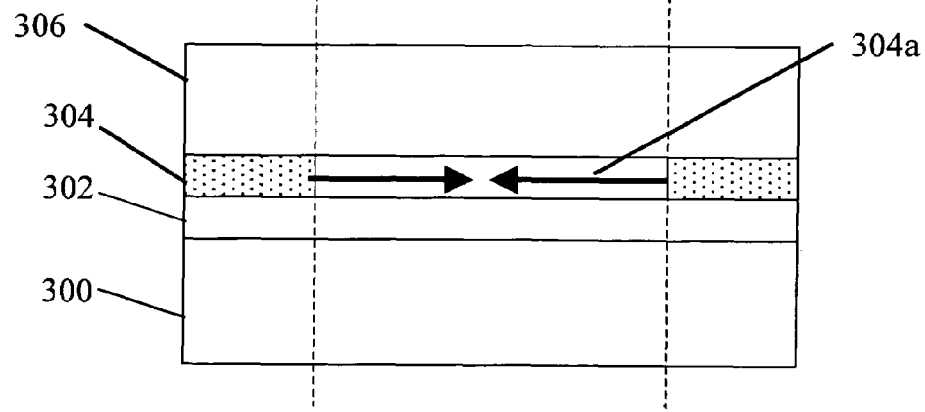

With reference to FIG. 3B, a laser beam 320 that is patterned to produce a sharp energy density gradient is used to irradiate the heat-retaining layer 306, producing a laser heating effect at specific positions in the a-Si layer 304. The a-Si layer 304 within the irradiation range of the laser beam 320 forms a super lateral growth crystallization region 304a. The laser beam 320 with a sharp energy density gradient may be a narrow-width (3~20 μm) linear beam formed using a pattern photo mask or an optical system, thereby producing a sharp energy density gradient in the laser energy distribution. Using the design of the pattern photo mask, the laser beam 320 is patternized. Therefore, the laser beam 320 can be controlled to irradiate specific positions on the a-Si layer 304. Besides, the laser beam 320 can be produced using a XeCl excimer laser in its ultraviolet spectrum.

Figure 3C:
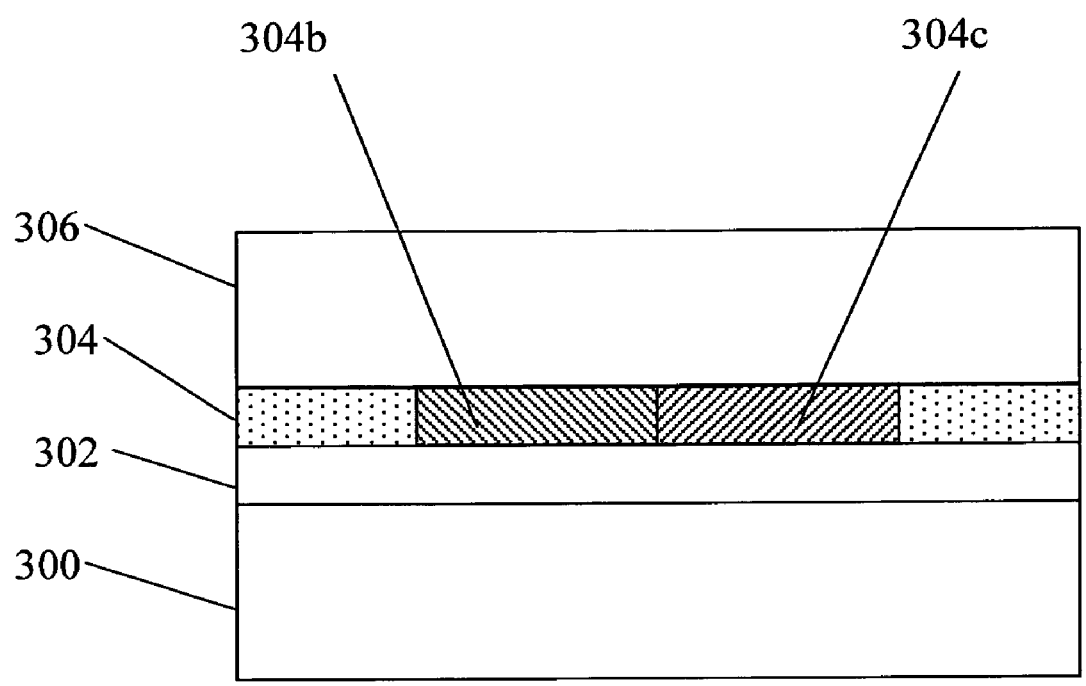

After the irradiation of the laser beam 320, the a-Si layer 304 has a wide-range temperature distribution. The region 304a receiving the laser beam 320 is in its high-temperature melting state. The part outside the region 304a is not irradiated by the laser beam 320 and thus is in a relatively low-temperature state. This induces the lateral crystallization in the a-Si layer 304, starting from the part with a lower temperature around the region 304a toward the inside of the region 304a. This renders the lateral growing grain 304b and the lateral growing grain 304c (FIG. 3C).

In FIG. 3B, the arrow indicates the lateral crystallization direction of the poly-Si. As this embodiment combines the auxiliary heating effect of the heat-retaining layer 306 and the use of the laser beam 320 with a sharp energy density gradient, the lateral crystallization of the poly-Si can be enhanced, greatly enlarging the grain size. For example, poly-Si with a lateral crystallization distance of about 5 μm can be produced in the lateral crystallization region 304a by irradiating once the laser beam 320 on the a-Si layer 304 in accord with the disclosed method.

Figure 4A:
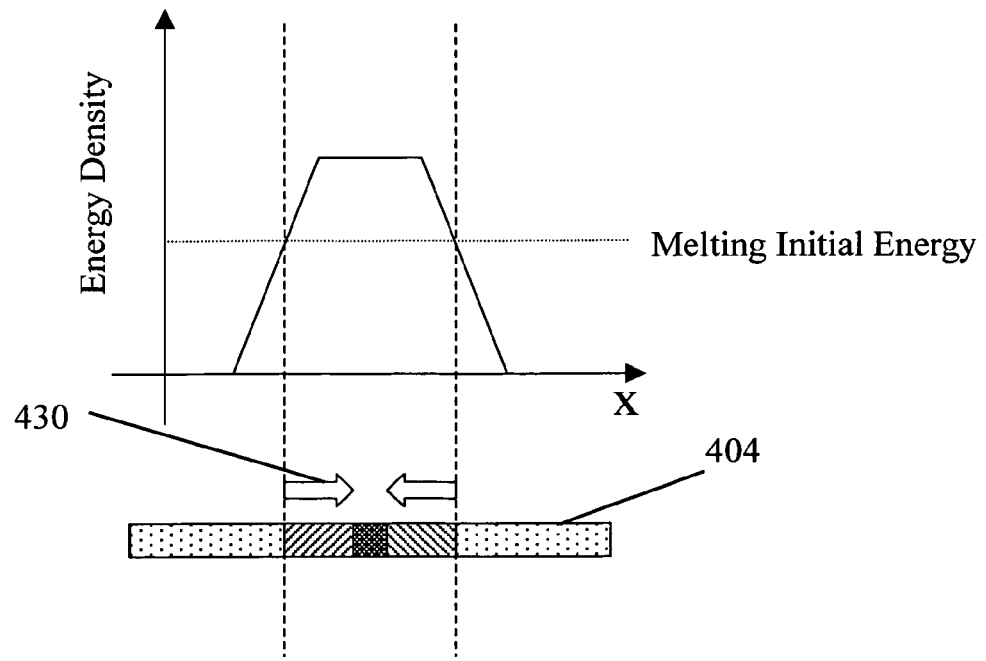
FIG. 4A is a schematic view of using a laser beam with a moderate energy density gradient for the crystallization of a Si layer.

Since the invention emphasizes the use of the laser beam with a sharp energy density gradient in the crystallization process, the lateral crystallization of the silicon crystal layer can be enhanced. FIG. 4A shows a schematic view of using a laser beam with a moderate energy density gradient for the silicon crystallization. The upper part of the drawing shows the energy density distribution of the laser beam. The lower part of the drawing shows the lateral crystallization of the silicon crystal layer 404. Suppose as shown in FIG. 4A that the ordinary laser crystallization process uses a laser beam with a moderate energy density gradient, then the solid-liquid interface in the silicon crystal layer 404 slowly forms. The difference between the heat contained in the liquid Si and solid Si is also smaller. Therefore, the induced super lateral crystallization length 430 is shorter.

Figure 4B:
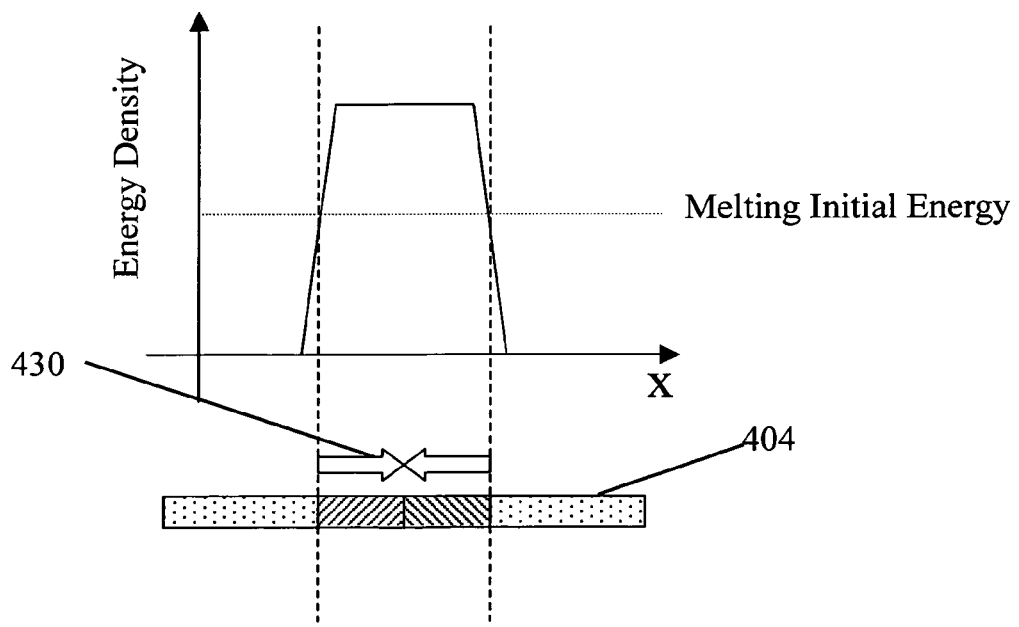
FIG. 4B is a schematic view of using a laser beam with a sharp energy density gradient for the crystallization of a Si layer.

As shown in FIG. 4B, the sharp energy density gradient enables the interior of the silicon crystal layer 404 easier and quicker to produce a noticeable solid-liquid interface. The difference in the heat contained in the liquid Si and solid Si is also relatively larger. Therefore, the temperature difference between the two sides of the solid-liquid interface is more significant. Therefore, not only is it easier for the silicon crystal layer 404 to generate nucleation sites, the induced super lateral crystallization length is also longer 430. Therefore, the silicon crystal layer 404 has a better super lateral growth crystallization effect.

In addition to the use of the heat-retaining layer and the laser beam with a sharp energy density gradient, the repeatedly moving laser crystallization technique further elongate the length of the super lateral growth crystallization for the poly-Si. Please refer to FIGS. 5A~5C. FIG. 5A is a schematic top view of FIG. 3C. Since the a-Si layer is covered with the heat-retaining layer, when the laser beam with a sharp energy density gradient first irradiates the a-Si layer, the auxiliary heating effect of the heat-retaining layer forms poly-Si crystals of the super lateral growing grain 504b and the super lateral growing grain 504c with a grain size of about 5 μm in the irradiation range 520.

Afterwards, the substrate 500 or the laser beam is moved by a distance, so that the laser beam irradiation range 520 moves and falls in the range of any lateral growing crystal grain 504c, forming a new irradiation range 520' in FIG. 5B for the second laser irradiation. In FIG. 5B, not only does the silicon crystal layer in the irradiation range 520' undergoes crystallization, the lateral growing crystal 504c formed by the first irradiation of the laser beam also has further melting and thus induces lateral crystallization because part of the region experiences the second laser irradiation. Therefore, the original lateral growing crystal grain 504c grows further, enlarging the range of the super lateral crystallization. For example, the poly-Si grain with a grain size of 5 μm after the first laser irradiation is enlarged to one with a grain size of about 8 μm. One finally obtains the poly-Si thin film shown in FIG. 5C.

As the invention simultaneously uses the designs of the heat-retaining layer and the laser beam with a sharp energy density gradient, super lateral growing poly-Si grains with a grain size of about 5 μm can be obtained after the first laser beam irradiation. Therefore, the displacement of the substrate or the laser beam can be greatly increased in the subsequent process. This enlarges the production window, therefore lowering the precision requirement of moving the substrate or the laser beam. For example, using the disclosed method only need a precision at the μm level for moving the substrate in the sequential lateral crystallization technique.

Embodiment 2

The invention further discloses another method of fabricating the poly-Si thin film. A square-SLS technique combined with the auxiliary heating effect of the heat-retaining layer is employed to make a poly-Si thin film with an approximately square shape and close to a single crystal.

Figure 6A:
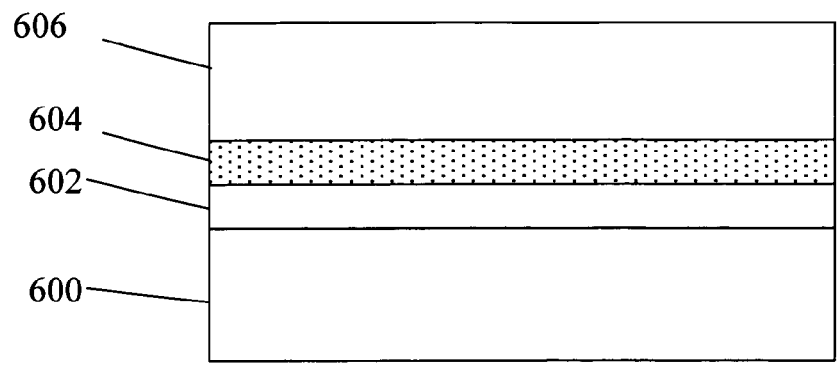
FIGS. 6A~6C are schematic cross-sectional views of a method of fabricating poly-Si thin films according to a second embodiment of the invention.
Figure 6B:
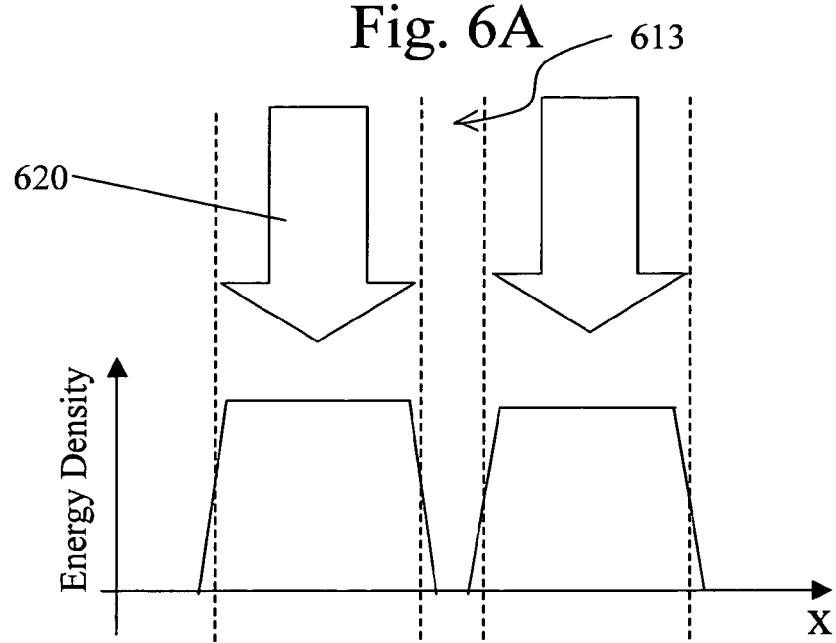
Figure 6B:
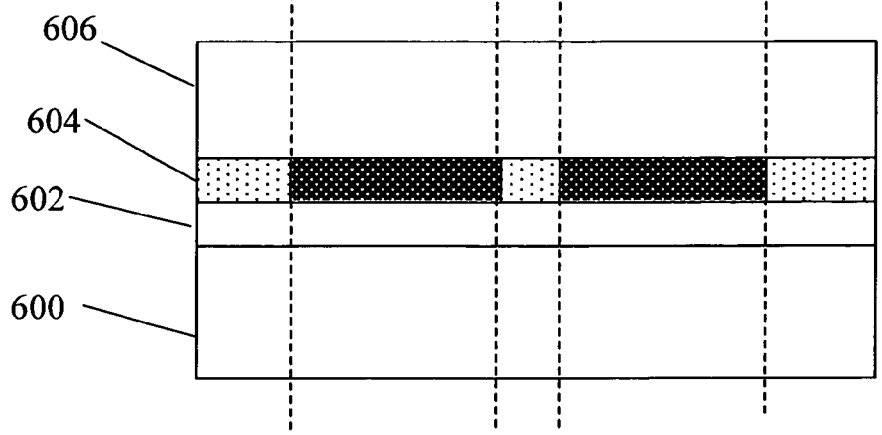
Figure 6C:
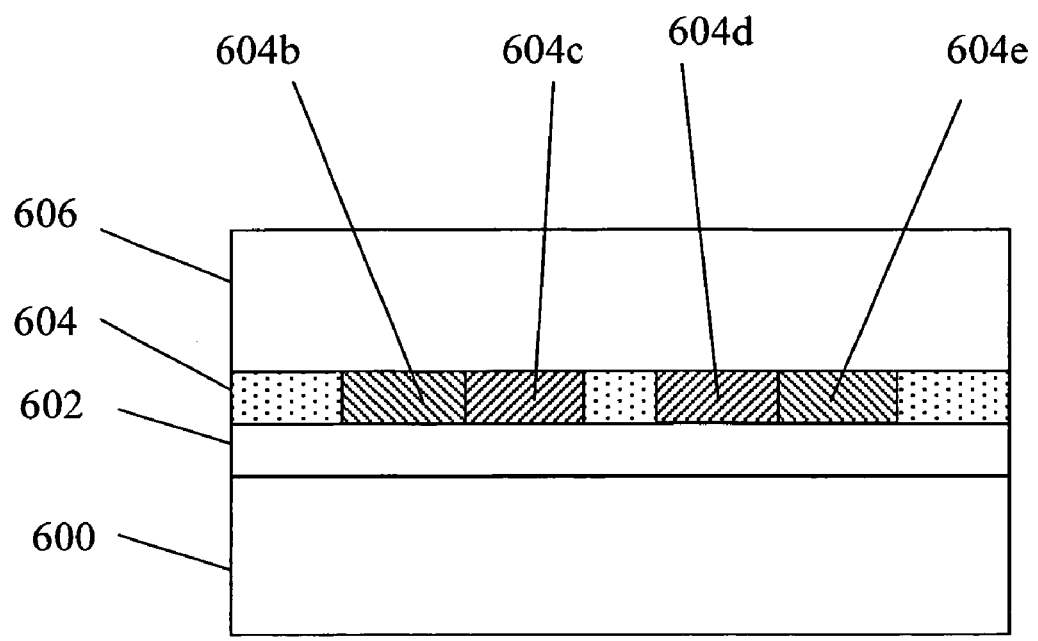

The second embodiment is illustrated in FIGS. 6A~6C. As described in the first embodiment, the substrate 600 in the current embodiment is also covered in sequence a buffer layer 602, an a-Si layer 604, and a heat-retaining layer 606. The material of the heat-retaining layer 606 is silicon oxide nitride. FIG. 6B shows that a laser beam 620 is used for heating. However, its difference from the first embodiment is in that the laser beam 620 with a sharp energy density gradient is blocked by a square photo mask during the laser heating process. Therefore, the laser beam 620 contains a hollow square region 613 that the laser beam cannot pass.

Figure 7:
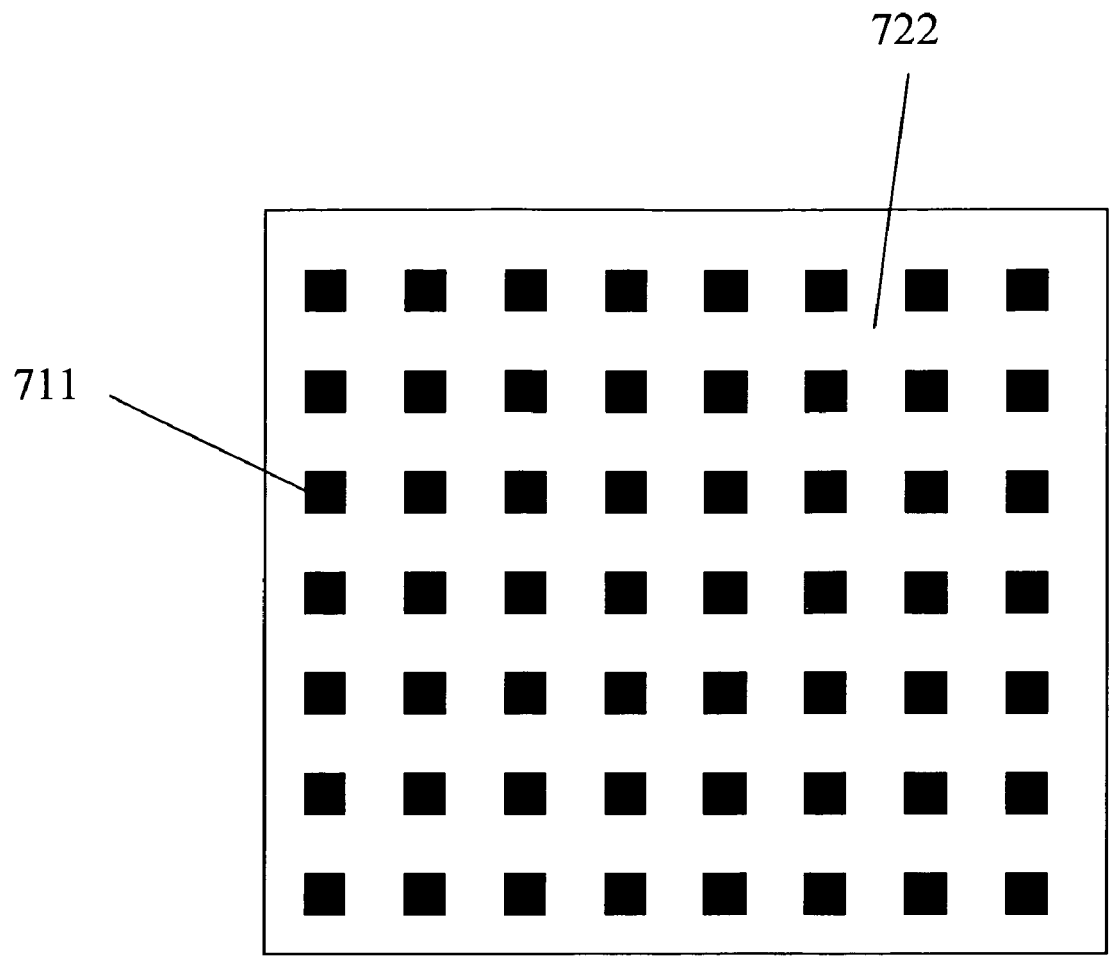
FIG. 7 is a schematic view of the laser beam photo mask used in a square-SLS technique according to the second embodiment of the invention.

With simultaneous reference to FIG. 7, the square photo mask 711 is used to block the passage of the laser beam. The region 722 that is not covered by the square photo mask 711 is the one that the laser beam can actually pass through and irradiate during the laser heating process. After the blocking of the photo mask, the laser beam produces a hollow square shape and has a sharp energy density gradient, as shown in FIG. 6B. The advantage of using the square photo mask in comparison with the doted photo mask is that there is fewer grain boundaries produced at the outer sides of the square corners when the poly-Si undergoes lateral crystallization in the radial direction outward. Therefore, there is a larger probability for it to form a single crystal in the subsequent crystallization process.

As this embodiment also adopts the design of covering the a-Si layer by the heat-retaining layer, the lateral crystallization produced by the laser irradiation can be enhanced in the silicon crystal layer, further increasing the length of the lateral crystal to reach a grain size of above 5 μm. With reference to FIG. 6C, after the laser heating process, only the region that is irradiated by laser in the silicon crystal layer 604 can produce lateral growing crystal grains 604b, 604c, 604d, and 604e.

Figure 8A:
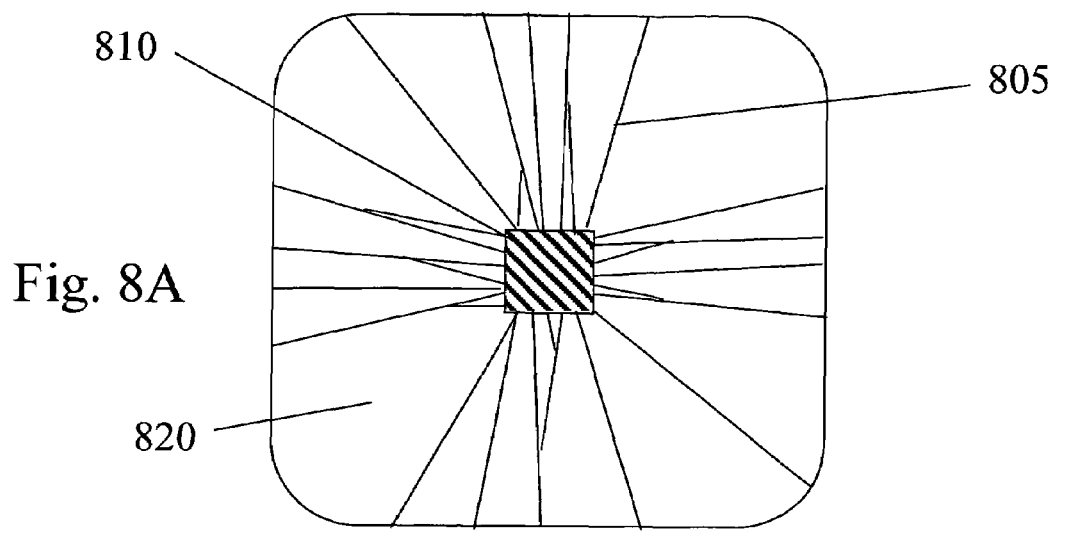
FIGS. 8A~8E are schematic top views of the sequential lateral crystallization process for poly-Si thin films according to the second embodiment.

After the steps in FIGS. 8A–8E, a large poly-Si grain close to a single crystal can be obtained. In FIG. 8A, the region 820 indicates the position in the Si layer that is actually irradiated by the laser beam. The square block 810 shows the position in the Si layer that is blocked by the square photo mask and not irradiated by the laser beam. Therefore, after the first laser irradiation, the lateral crystallization of the Si layer starts from the outer border of the square block 810 in the radially outward direction. In particular, the grain boundary 805 shows the crystallization direction and structure of the poly-Si. Since the heat-retaining layer covers the poly-Si layer in this invention, the length of the first lateral crystallization can reach about 5 μm.

Figure 8B:
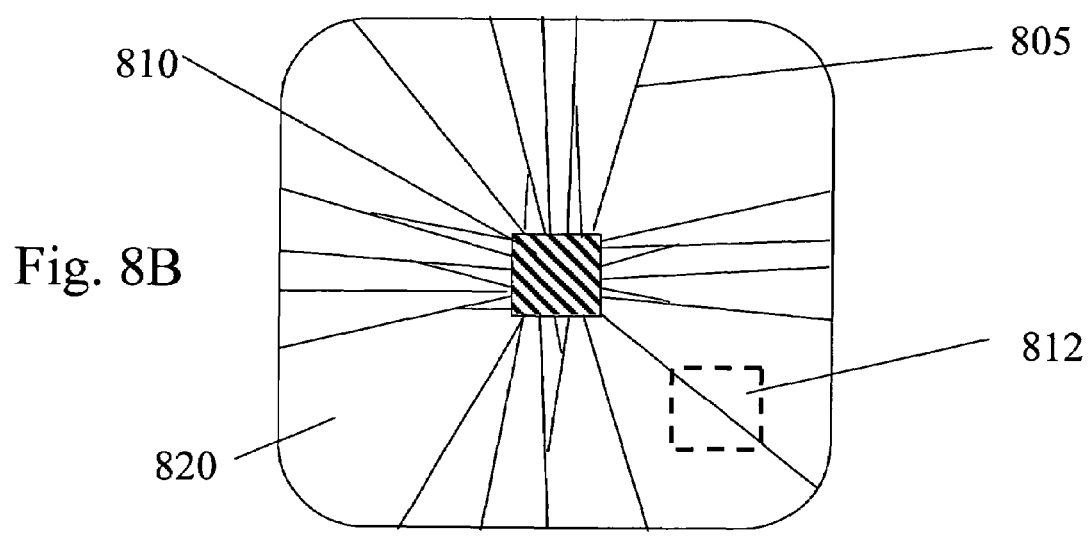
Figure 8C:
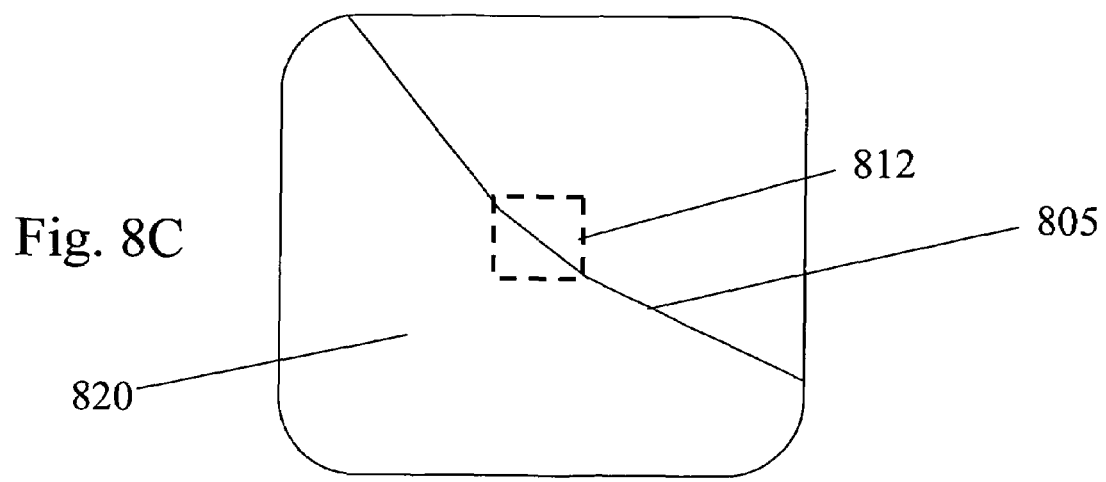
Figure 8D:
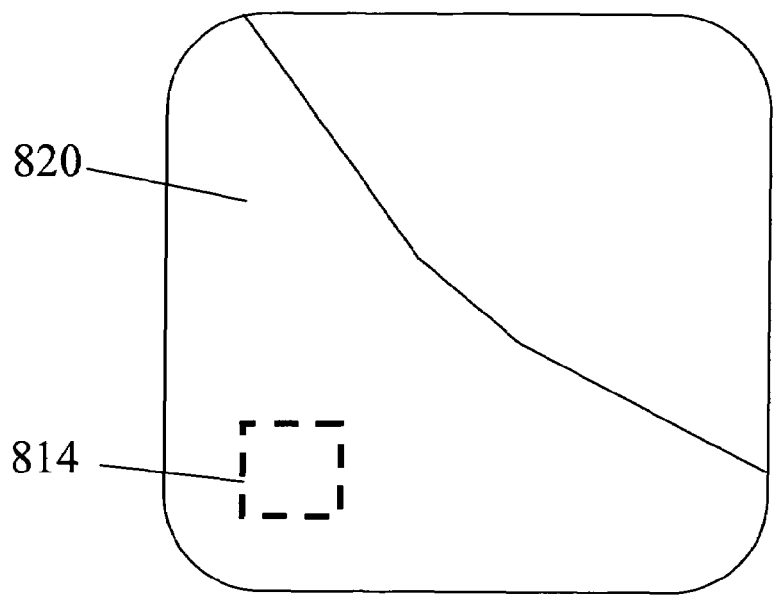
Figure 8E:
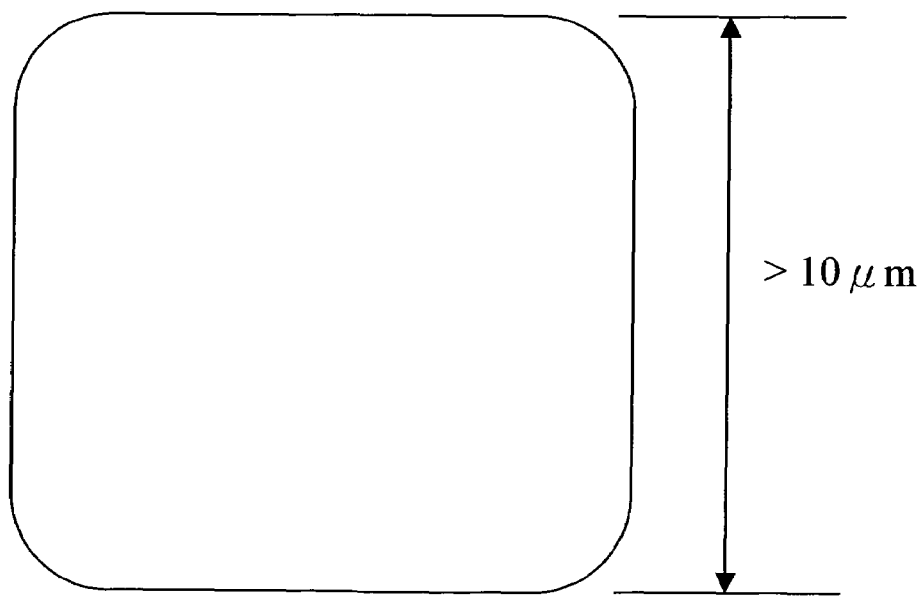

Afterwards, the laser beam irradiation position is first moved. As shown in FIG. 8B, the square block 810 is moved along its diagonal direction to the position 812 (indicated by the dashed line), thereby moving the square block 810 within the range of any lateral crystallization for the second laser irradiation. Therefore, the silicon crystal layer again undergoes sequential lateral crystallization in the radial direction from the outer border of the position 812, further growing the initially formed grain and removing part of the grain boundary 805. This renders the crystal shown in FIG. 8C. Afterwards, the irradiation position of the laser beam is moved for the second time. The square block 810 moves from the position 812 along its diagonal direction to the position 814, so that it falls within the lateral crystallization range of another poly-Si. There is a large probability for the square block 810 to fall right on the position without a grain boundary for the third laser irradiation, as shown in FIG. 8D. Likewise, after the third laser irradiation, the interior of the silicon crystal layer undergoes sequential lateral crystallization from the outer border of the position 814 outward. Therefore, after this irradiation the leftover grain boundary 805 can be readily removed, forming the single crystal state shown in FIG. 8E.

The disclosed method can form a crystal grain of 5 μm long from lateral crystallization after the first laser irradiation. The square block used in this embodiment has a side length of 1.5 μm only. Therefore, even though each time the laser beam has to be moved in such a way that the square block falls within the range of the silicon lateral crystallization, the precision requirement for either the laser beam or the substrate is considerably lower than the conventional dot-SLS technique. Moreover, the number of times of moving the laser or the substrate is also reduced. That is, a large grain or single crystal structure can be successfully obtained from super lateral growth crystallization with fewer times of laser irradiation.

Furthermore, using the disclosed method can render polycrystals or single-crystals with a grain size of about 10 μm or above.

From the above-mentioned embodiments, one sees that the disclosed method uses a laser beam with a sharp energy density gradient to induce super lateral crystallization in the a-Si layer. Moreover, the invention uses a heat-retaining layer to cover the Si layer. With the continuous heating effect of the heat-retaining layer, the crystallization growth time of the silicon crystal layer after the laser irradiation can be elongated, further enlarging the crystal grain size.

Besides, by moving the substrate or the laser beam, the laser beam can sequentially fall at different positions on the substrate for the crystallization of the entire substrate. If the laser beam is controlled to fall within the lateral growth range of the crystal grain on the silicon layer so that the crystal sequentially grows, then the grain size can be even larger.

The use of the heat-retaining layer on the silicon crystal layer in accord with the invention helps enlarging the crystal grain size. Therefore, during the SLS process in which either the substrate or the laser beam has to be moved, the displacement of the substrate or the laser beam can be greatly increased. This increases the yield and enlarges the production window, thereby reducing the precision requirement in moving the substrate or the laser beam. It may involve very few sequential movements of the laser or the substrate. That is, the number of times of the laser irradiation can be effectively reduced, simplifying the production and saving the cost. Therefore, either the ordinary SLS technique or the dot-SLS technique can employ the disclosed method to greatly improve the quality and yield of the poly-Si thin film. In addition to effectively produce crystal grains with a size above the micron level, the number of grain boundaries is also greatly reduced. The poly-Si thin film may even reach the high-quality single crystal state, with a grain size above 10 μm.

Therefore, applying the disclosed method of fabricating poly-Si thin film to the production of poly-Si TFT's can render highly-efficiency and high-value devices. This can also facilitate the development and mass production of large-area displays.

It should be emphasized that the disclosed method is not limited to the fabrication of the TFT's of flat-panel displays, the production of any poly-Si TFT driven devices and poly-Si thin films can employ the invention to increase the efficiency.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of fabricating a polysilicon (poly-Si) thin film, comprising the steps of:

forming a silicon layer on a substrate;

forming a heat-retaining layer directly on the silicon layer, wherein the entire bottom surface of the heat-retaining layer is in direct contact with the entire top surface of the silicon layer;

patterning at least one laser beam to produce a patterned laser beam with an energy density gradient occurring at the edges of the patterned laser beam, wherein the range of the energy density gradient is between 400 J/cm$^3$ and 3000 J/cm$^3$;

irradiating the patterned laser beam with the energy density gradient to the heat-retaining layer so as to perform a laser heating process for inducing super lateral growth crystallization occurred in part of the silicon layer; and repeatedly moving the patterned laser beam to irradiate different positions of the substrate until the crystallization process for the full substrate is finished.

2. The method of claim 1, wherein the step of forming the silicon layer is preceded by the step of forming a buffer layer on the substrate.

3. The method of claim 1, wherein the material of the substrate is glass.

4. The method of claim 1, wherein the heat-retaining layer is $SiO_xN^y$.

5. The method of claim 1, wherein the patterned laser beam with the energy density gradient is an excimer laser using the ultraviolet light of XeCl.

6. The method of claim 1, wherein the patterned laser beam with the energy density gradient is formed by using a pattern photo mask to block part of the laser beam.

7. The method of claim 1, wherein the patterned laser beam with the energy density gradient has a long strip pattern.

8. The method of claim 1, wherein step of moving the patterned laser beam is achieved by moving the patterned laser beam directly or moving the substrate.

9. The method of claim 1, wherein the patterned laser beam with the energy density gradient is formed by using an optical system to adjust the laser beam to a narrower width.

10. The method of claim 1, wherein the patterned laser beam with the energy density gradient has a hollow square region.

* * * * *